United States Patent [19]

Tuzi et al.

[11] 3,771,219

[45] Nov. 13, 1973

[54] METHOD FOR MANUFACTURING SEMICONDUCTOR DEVICE

[75] Inventors: Takateru Tuzi; Katunobu Awane, both of Nara; Mutuo Matunami, Osaka, all of Japan

[73] Assignee: Sharp Kabushiki Kaisha, Osaka, Japan

[22] Filed: Feb. 2, 1971

[21] Appl. No.: 111,912

[30] Foreign Application Priority Data

| | | |
|---|---|---|
| Feb. 5, 1970 | Japan | 45/10124 |
| Aug. 19, 1970 | Japan | 45/72508 |
| Sept. 1, 1970 | Japan | 45/76919 |
| Oct. 5, 1970 | Japan | 45/87291 |

[52] U.S. Cl. .......... 29/583, 29/580, 29/589

[51] Int. Cl. .......... B01j 17/00

[58] Field of Search .......... 29/578, 589, 580, 29/583

[56] References Cited

UNITED STATES PATENTS

| | | | |
|---|---|---|---|
| 3,550,261 | 12/1970 | Schroeder | 29/589 |
| 3,590,478 | 7/1971 | Takehana | 29/578 |
| 3,495,324 | 2/1970 | Guthrie | 29/578 |

*Primary Examiner*—Charles W. Lanham
*Assistant Examiner*—W. C. Tupman
*Attorney*—Flehr, Hohbach, Test, Albritton & Herbert

[57] ABSTRACT

A method for manufacturing a semiconductor device such as an integrated circuit or a discrete transistor includes a step of forming beam-leads to permit chips to be face-up bonded to a substrate, the beam-leads in a certain chip expanding to the neighboring chip across the boundary between said two chips.

10 Claims, 38 Drawing Figures

INVENTORS
TAKATERU TUZI
KATUNOBU AWANE
MITUO MATUNAMI

BY Flehr, Hohbach, Test, Albritton & Herbert
ATTORNEYS

PATENTED NOV 13 1973

3,771,219

SHEET 2 OF 7

INVENTORS
TAKATERU TUZI
KATUNOBU AWANE
MITUO MATUNAMI

BY Fleh, Hohbach, Test, Albritton & Herbert
ATTORNEYS

INVENTORS
TAKATERU TUZI
KATUNOBU AWANE
MITUO MATUNAMI
BY Flehr, Hohbach, Test, Albritton & Herbert
ATTORNEYS INVENTORS
TAKATERU TUZI
KATUNOBU AWANE
MITUO MATUNAMI
BY Flehr, Hohbach, Test, Albritton & Herbert
ATTORNEYS

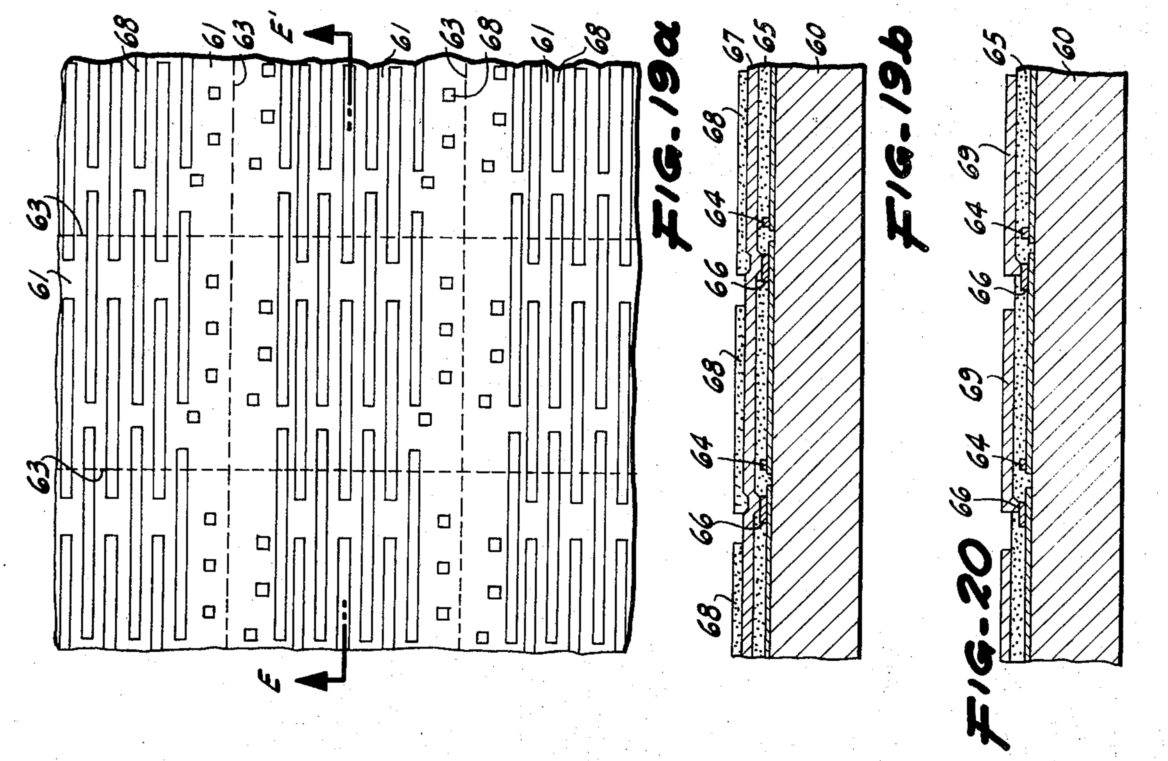
FIG. 19a, FIG. 19b, FIG. 20
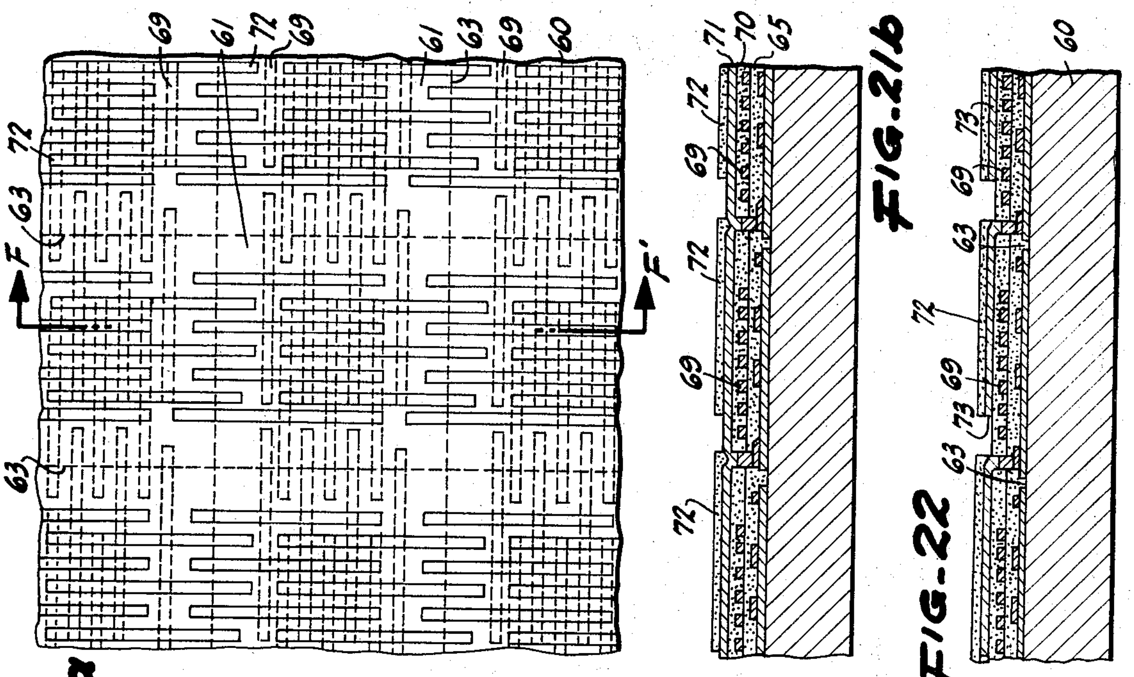
FIG. 21b, FIG. 22
FIG. 21a
INVENTORS
TAKATERU TUZI
KATUNOBU AWANE
MITUO MATUNAMI
BY Flehr, Hohbach, Test, Albritton & Herbert
ATTORNEYS INVENTORS
TAKATERU TUZI
KATUNOBU AWANE
MITUO MATUNAMI
By Flehr, Hohbach, Test, Albritton & Herbert
ATTORNEYS INVENTORS
TAKATERU TUZI
KATUNOBU AWANE
MITUO MATUNAMI
BY Flehr, Hohbach, Test, Albritton & Herbert
ATTORNEYS

METHOD FOR MANUFACTURING SEMICONDUCTOR DEVICE

BACKGROUND OF THE INVENTION

This invention relates to a method for manufacturing a semiconductor device such as an integrated circuit or a discrete transistor, and more particularly, to an improved method for manufacturing a semiconductor device having beam-leads.

Various wireless bonding techniques which avoid disadvantages of wire bonding, are already developed. The beam-lead technique is one of the most typical wireless bonding techniques.

According to the conventional beam-lead technique, an extra region is established in the boundary between chips and a metal layer is deposited on the extra region. After the metalization the metal layer is selectively plated with a gold to form beam-leads. Chip separation is accomplished by so-called "etch-cut" technique. In practice, etching is carried out to the back of a semiconductor wafer to remove the extra region of wide enough to deposite beam-leads and then the wafer is divided into individual chips.

In a subsequent assembly the beam-lead system make it possible to reduce the number of process on a large scale and also to improve the reliability owing to disuse of an extreme thin wire which is usually used in the wire bonding system. Furthermore, this system make it possible to occur no damage to chips in bonding process. however, according to the conventional system there is necessity of establishing an extra region of wide sufficient to deposite the beam-leads and thus it is unable to cheapen the cost of chip production.

Instead of this, so-called "face-down bonding" system with the shortended beam-leads is used in the next succeeding chip ponding to overcome the said disadvantage. As a setback, it has this disadvantage, that radiation of heat is poor since heat from the chip is radiated to outside only through the shortended beam-leads. In addition, the beam-leads should be led out from the edges of a chip and accordingly pad member to be connected with the beam-leads should be deposited on the edges of the chip without fail. This puts restrictions on pattern design for an integrated circuit arrangement.

OBJECTS AND SUMMARY OF THE INVENTION

Accordingly, a primary object of this invention is to provide an improved method for manufacturing a semiconductor device which avoids one or more of the disadvantages and limitations of prior art.

Another object of this invention is to provide an improved method which needs no establish an extra wide region between the neighboring chips.

Yet another object ofthis invention is to provide an improved method which can make a semiconductor chip having beam-leads of length enough to free from contrivance about radiation of heat and to permit the chip to be face-up bonded to a substrate.

Still another object of this invention is to provide an improved method which can make a semiconductor chip having beam-leads mechanically and strongly bonded to its contact or interconnection pattern.

Further object of this invention is to provide an improved method which can make a beam-lead semiconductor device with simple process and low cost.

Another object of this invention is to provide an improved semiconductor device wherein chip separation can be carried out with ease.

An additional object of this invention is to provide an improved semiconductor device with the reduced parasitic capacitance between the beam leads.

In summary, this invention provides an improved method for manufacturing semiconductor device comprising the following steps of; preparing a semiconductor wafer wherein a plurality of semiconductor chips, each chips including at least one circuit element; depositing at least on lead, the lead in a certain chip being electrically connected with the circuit element and extending to the neighboring chip across the boundary between said two chips; and separating the chips from the semiconductor wafer.

Further details will be apparent from the following explanation of examples of embodiments of this invention with reference to the accompanying drawings.

BRIEF DESCRIPTION OF THE DRAWINGS

FIGS. 1 through 7 show each step in a first example according to this invention.

FIGS. 1*a* and 1*b* show the semiconductor wafer on which an interconnection pattern is deposited.

FIG. 2 shows the semiconductor wafer on which an evaporated-metal layer through a spacer film.

FIG. 4 shows the wafer from which the spacer film is removed.

FIG. 5 shows the wafer of which the back is scribed.

FIG. 6 shows the chip separated from the wafer.

FIG. 7 shows the semiconductor device which is face-up bonded to a substrate.

FIGS. 8*a* through 16 show each step in a second example according to this invention.

FIGS. 17*a* through 25 show each step in a third example.

DESCRIPTION OF THE PREFERRED EMBODIMENTS

Example I

Figure 1A:
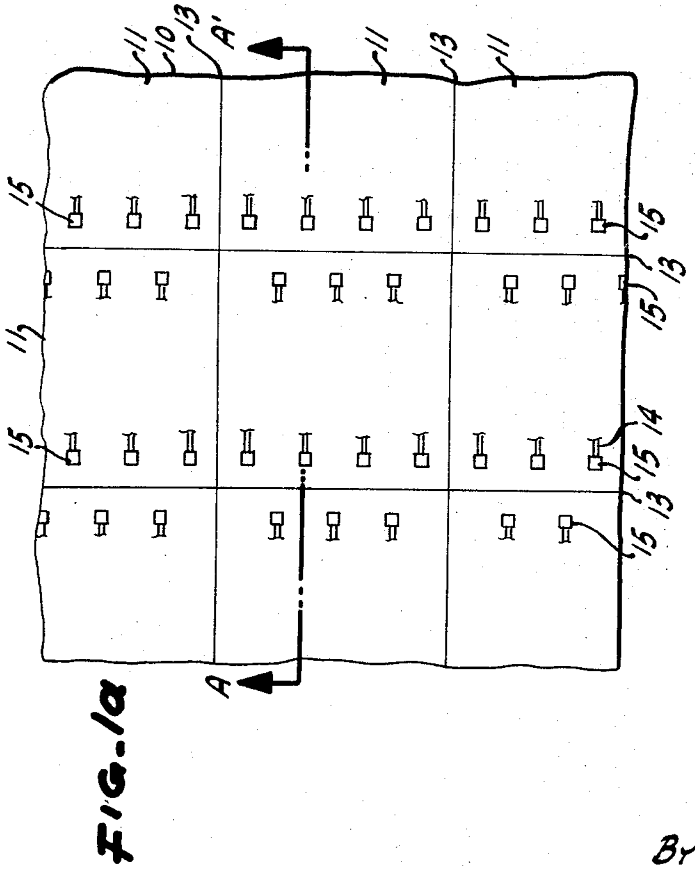
Figures 1B, 2:
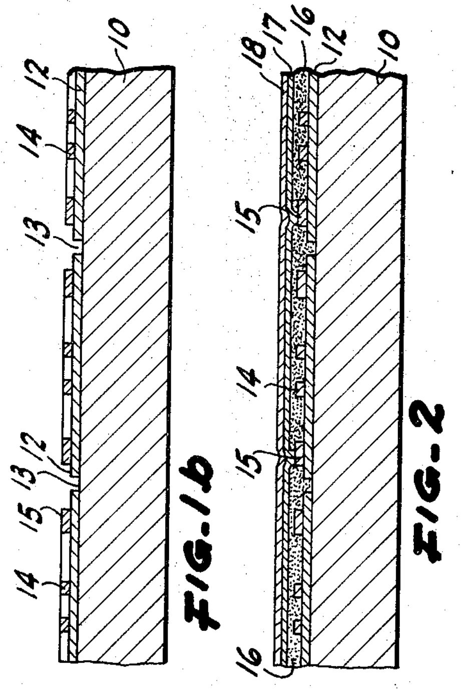

Referring to FIGS. 1*a* and 1*b*, a silicon semiconductor wafer 10 has a plurality of semiconductor chips 11, 11 wherein an integrated circuit is formed. The integrated circuit is made up by the conventional diffusion and planar techniques. During the diffusion and planer processes a surface of the silicon wafer 10 is coated with a silicon dioxide layer 12. After diffusion and planer processes, contact windows are etched open in the appropriate areas of the silicon dioxide layer 12 corresponding terminal areas of the circuit element. At the same time each boundary area between the neighboring chips 11, 11 is etched to make a marker 13. An interconnection pattern layer 14 is deposited with vacuum evaporated-aluminum layer. To form the interconnection patter, the evaporated-aluminum is deposited over the entire surface of the wafer 10 and then the deposited-aluminum is selectively etched with photoetching in accordance with the predetermined pattern. The pad member 15 connected with the interconnection layer 14 serves as the medium of electrical conduction between the interconnection layer 14 and an external terminal. Each pair of the pad members 15, 15 facing each other in the vicinity of the chip boundary are respectively placed with the shifted positions. The wafer 10 is next annealed in an atmosphere of a vacuum or hydrogen ($H_2$) or mixed gases of nitrogen ($N_2$) and hydrogen ($H_2$) to obtain good ohmic contacts in each chip 11, 11. Since the anneal process is carried out in the above-mentioned atmosphere, the oxidadation is not found out from the upper faces of the interconnection layer 14 and the pad member 15. As shown in FIG. 2, the whole upper face of the wafer 10 is painted with a photoresist to form the spacer film 16 and then only the spacer film 16 coating on the pad material 15 is removed so as to expose the upper face of the pad material 15. The wafer 10 is next subjected to vacuum evaporation treatments with metals such as aluminum and nickel which will produce evaporated-aluminum layer 17 and evaporated-nickel layer 18 on the spacer film 16. An aluminum evaporated layer 17 may cause the thermal shock or the damage of the photoresist film 16 to lighten during the evaporation process. The formation of two layers 17 and 18 is to strengthen mechanical and electrical bonds between the pad member 15 and beam-lead mentioned below. Alternatively, the silicon dioxide layer 12 around the pad member 15 is also exposed and the layers 17 and 18 are deposited on the exposed dioxide layer 12 as well as the pad member 15 in order to widen the bonding area between the evaporated layer 17 and chip 11 thereby to increase jointing strength between the chip and beam-leads. The formation of the upper layer 18 is not necessarily carried out.

Figures 3A, 3B, 3C:
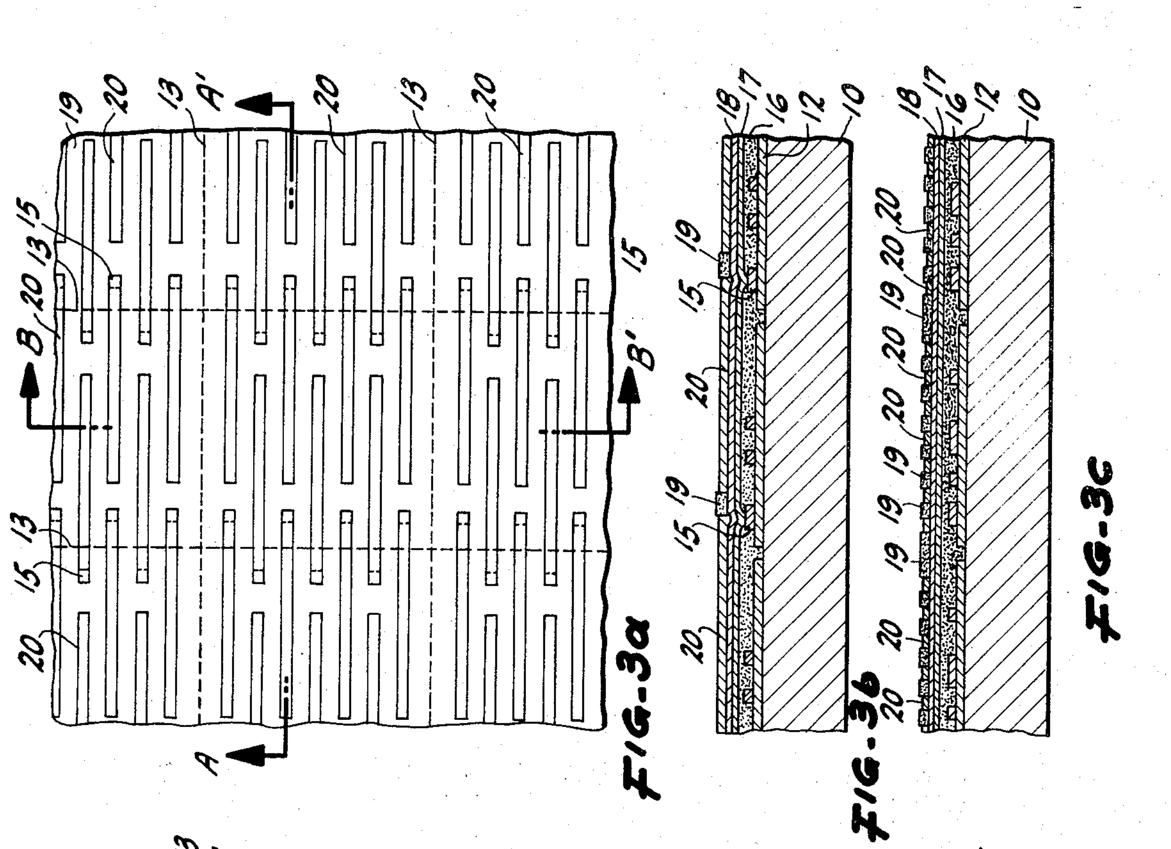
FIGS. 3*a* through 3*c* show the wafer on which beam-leads is deposited, extending from a certain chip to the neighboring chip.
Figure 4:
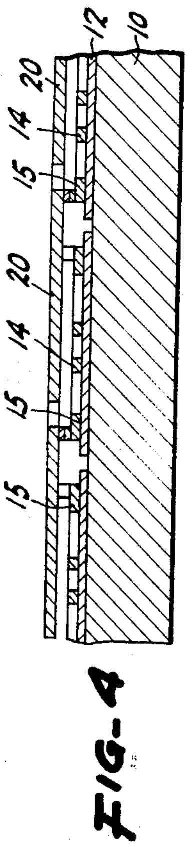
Figure 5:
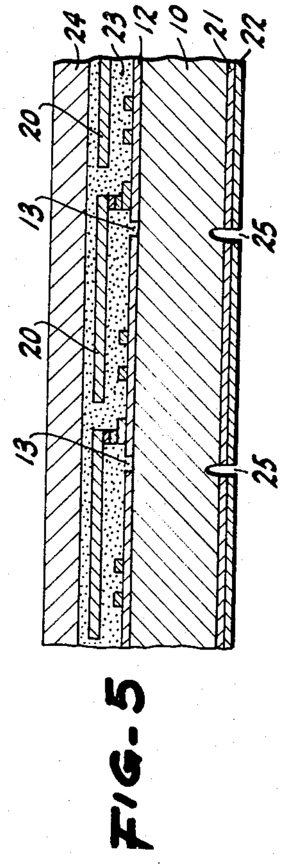

In FIGS. 3*a* through 3*b* all the upper face of the wafer 10 is next coated with a photoresist material 19. The pattern is then photographically applied to the resist surface and is developed by means well known in the art. The exposed surface of the upper evaporated-metal layer 18 extends from the pad area in a certain chip 11 to the neighboring chip 11 across the boundary marker 13. The remained photoresist layer 19 serves as a mask during the next succeeding plating process. The electroplating treatment is applied to the exposed layer 18 in order to form beam-leads 20, 20 such as gold beam-leads having a thickness of about 10 microns. The beam-leads 20, 20 may be lengthen to a width of a chip. However, a length of beam-lead 20 in range from 400 microns to 500 microns is sufficient to permit the chip to be face-up bonded to a substrate, since the chip 11 has a thickness of about 100 microns to about 150 microns. Subsequently, after the removal of the photoresist layer 19, the wafer 10 is subjected to the action of etchants. The unnecessary nickel layer 18 is first etched with dilute nitric acid and then the aluminum layer 17 is etched with phosphoric acid. In addition, the phtoresist layer 16 is removed from the wafer 10. The result of these treatment is the structure shown in FIG. 4 in which the beam-lead 20 in a certain chip is distant from the upper face of the neighboring chip.

Figure 6:
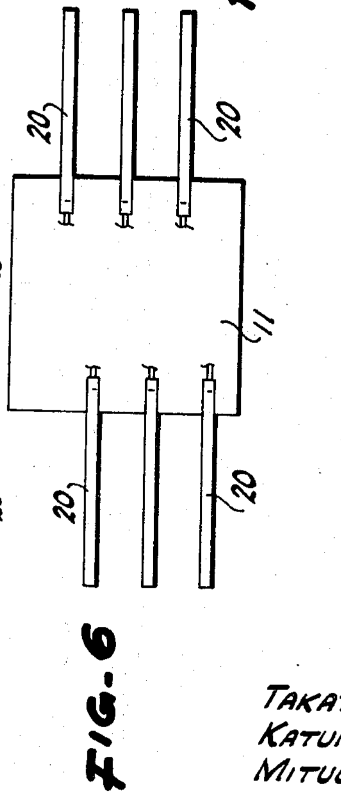
Figure 7:
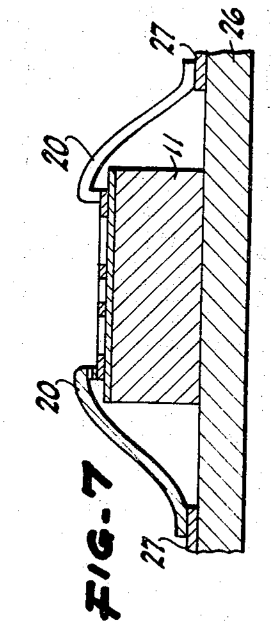

After the evaporated-gold layer 21 is formed on all the back face of the wafer 10, it is selectively removed along the boundary marker 13. The remained layer 21 is furthermore electroplated with gold to form the plated layer 22. The wafer 10 is upside down mounted on a glass plate 24 with wax 23. The back face of the wafer 10 is etched with hydrofuloric acid-nitric acid to form cracks 25, 25 along the boundary markers 13, 13. After the removal of the wax 23 and the glass plate 24, on the application of the force individual chip 11 having beam-leads 20, 20 is separated from the wafer 10. FIG. 6 shows the chip 11 after the separation. In case of chip-bonding there is no necessity for depositing a leaf-gold because of the formation of the plated-gold layer 22. As shown in FIG. 7, beam-lead chip 11 is face-up bonded to the appropriate substrate 26 and its beam-leads 20, 20 are respectively bonded to the lead contacts 27. 27.

Example II

Figure 8A:
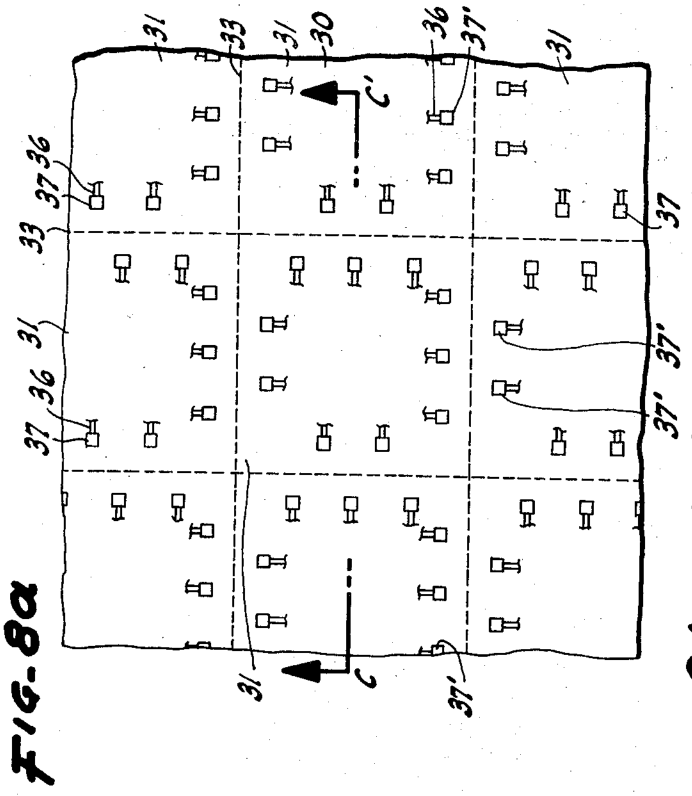

Referring to FIGS. 8*a* vacuum 8*b*, according to the predetermined pattern the silicon dioxide layer 32 on the silicon wafer 30 is photographically etched to form contact windows and to form boundary markers between chips 31, 31. All the upper face of the wafer 30 is next subjected to aluminum evaporation and anneal treatments to obtain ohmic contact. Then the aluminum layer is etched except contact area. Cracks 33, 33 are formed by scribing equipment. In addition, the wafer 30 is subjected to cacuum evaporation treatment with metals such titanium and nickel to cause two layers 34 and 35 for interconnection to produce. Since the bonding between the silicon dioxide layer 32 and the evaporated-titanium layer 34 has influence upon the mechanical strength of beam-leads, it is desirable that wafer temperature is maintained at a comparative high temperature. For example, our experiment wherein it is set at about 300° c gave a good results.

Figure 8B:
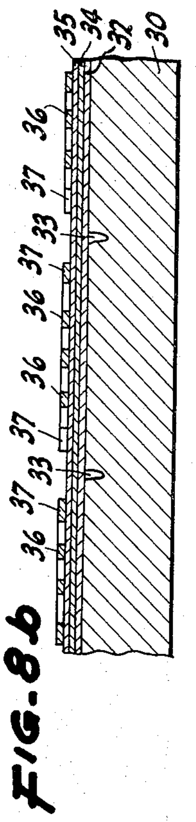

A photoresist layer is deposited on all the upper face of the wafer 30 and then the photoresist layer covering on the interconnection pattern and pad areas is removed to form a mask for selective electroplating. The wafer 10 is next subjected to plating treatment to produce interconnection gold layers 36, 36 and gold pad members 37, 37, 37′, 37′, It is desirable that each pair of the pad members 37, 37, 37′, 37′ facing each other in the vicinity of the chip boundary are respectively placed with the shifted positions, as shown in FIG. 8.

Figure 9:
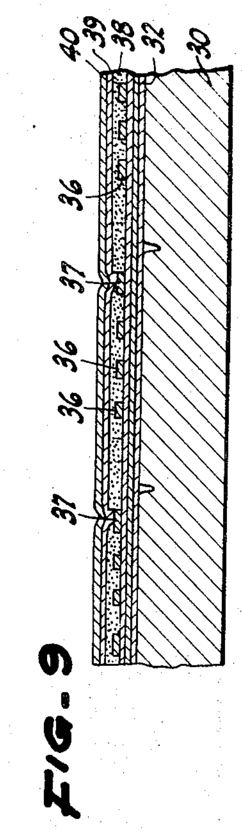

In FIG. 9 a photoresist layer is again deposited on all the upper face and then the photoresist layer covering on the pad members 37, 37, 37′, 37′ is only removed to expose the surface of the pad member. At this time the remained photoresist layer serves as a spacer film 38. The wafer 30 is subjected to vacuum evaporation treatments with aluminum and nickel to produce a aluminum layer 30 and nickel layer 40. During the evaporation process temperature of the wafer 30 should be limited not to damage the photoresist layer (for conventional photoresist: 200° C).

Figures 10, 11A, 11B, 12, 13A, 13B:
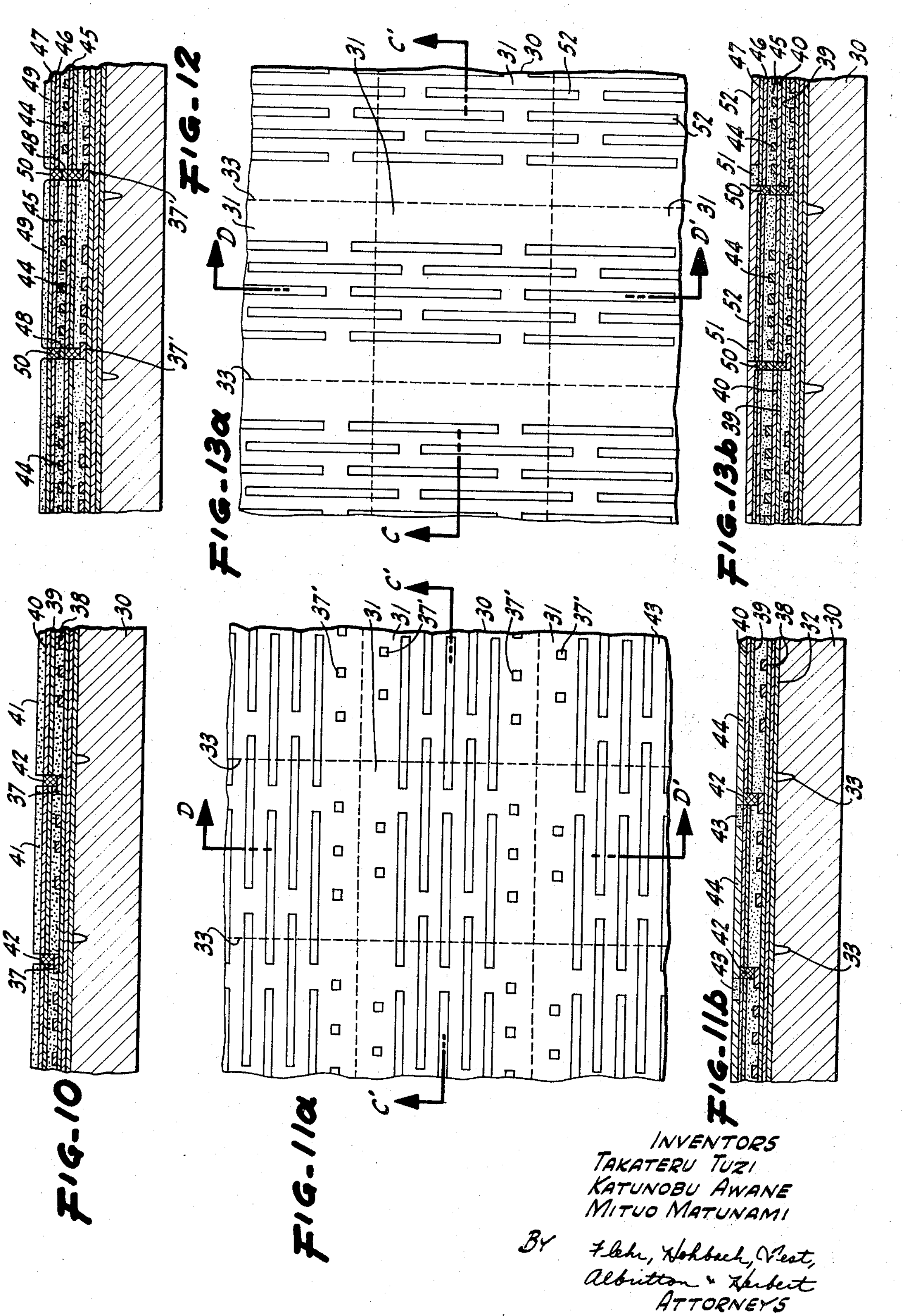

Furthermore, after all the face of the wafer 30 is coated with photoresist material, the photoresist layer covering on all the pad members 37, 37, 37′, 37′ is removed by means of photoetching treatment to make etching mask 41 as shown in FIG. 10. The nickel and aluminum layers 40 and 39 covering on the pad member are, therefore, removed with etchants of dilute nitric acid and phosphoric acid to cause the pad surface to be exposed. The exposed surface of the pad member is next subjected to electroplating with gold to produce the plating layers 42, 42. At this time the upper face of the plating layer 42 should be placed in the same plane as that of the remained nickel layer 40. The electroplating treatment is carried out in order to obtain a strong bonds between the pad member and the beam-lead. Alternatively, gold layer 42 may be made in succeeding process of forming beam-lead.

After the removal of all the remaining photoresist layer 41, all the upper face of the wafer 30 is newly coated with photoresist material 43. The pattern as shown in FIGS. 11a and 11b is applied to this resist surface and developed. As explained in Example I, the exposed surface extends from the pad area in a certain chip 31 to the neighboring chip 31 across the boundary. A length of the exposed surface is selected to permit the chip to be face-up bonded. The application of the pattern is accomplished by the removal the the photoresist material 43 thereby to cause the gold and nickel layers 42 and 40 to be selectively exposed. Then, the exposed gold and nickel layers 42 and 40 are electroplated with gold to form first beam-leads 44, 44 with thicknesses of about 10 microns. It will be noted that the pad members 37', 37', on which beam-lead is not formed, is also plated with gold not to produce a depression.

Again, the whole upper face of the wafer 30 is painted with photoresist material and then, as shown in FIG. 12, the photoresist layer covering on the said pad members 37', 37' is removed to form a second spacer film 45. The wafer 30 is again subjected to successive vacuum evaporation treatments with aluminum and nickel at the said temperature to form the evaporated aluminum and nickel layers 46 and 47. After the formation of the photoresist layer 49 on all the upper face, the layer 49 coating on the remaining pad members 37',37' is removed to expose the upper face of the nickel layer 47. The nickel and aluminum layers 47 and 46 on the pad members 37', 37' are removed with etchants of nitric acid and phosphoric acid to expose the upper face of the gold layer 48. During the beam-lead process mentioned above the gold layer 48 is also formed. By the use of photoresist mask 49 the gold layer 48 is furthermore plated with gold to form the gold layer 50. The upper face of the gold layer 50 should be placed in the same plane as that of the remained nickel layer 47. These plating treatment is accomplished in order to increase mechanical and electrical connection between the pad member and the following beam-lead.

Figure 14:
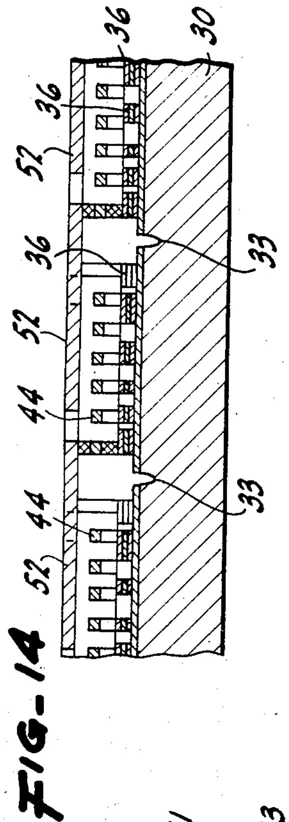

To deposite second beam-lead the remaining photoresist layer 49 is removed and, as shown in FIGS. 13a and 13b, further the whold upper face of the wafer 30 is newly coated with photoresist material. In the same way as the first beam-lead deposition, the pattern is applied to new resist surface and development is carried out. After the development the exposed surface extends from the pad areas 37', 37' in a certain chip to the neighboring chip across the boundaries 33, 33. The mask 51 is formed during photoetching process. Then, the exposed gold and nickel layers 50 and 47 are electroplated with gold to form second beam-leads 52, 52 with thicknesses of about 10 microns. The first and second beam-leads 44 and 52 intersect at right angles in different planes. The remaining photoresist layer 51 is removed by appropriate solvent and furthermore the nickel and aluminum layers 47 and 46 are respectively removed by use of etchants dilute nitric acid and phosphoric acid. The removal of the second spacer film 45 causes the second beam-leads 52, 52 in a certain chip to be distant from the upper face of the neighboring chip, as shown in FIG. 14. In addition, the nickel and aluminum layers 40 and 39 are respectively removed with the above-mentioned etchants. The result of the removal is the structure in which the first beam-leads 44, 44 are also distant from the upper face.

In the final step the nickel and titanium layers 35 and 34 other than the interconnection layers 36, 36 are removed by etching techniques to complete the interconnection. Of cource, after the interconnection gold layer 36 is formed by electroplating treatment, the nickel and titanium layers 35 and 34 may be previously removed by etching techniques to complete the interconnection and subsequently the chip boundary may be scribed by scribing equipment.

Figures 15, 16:
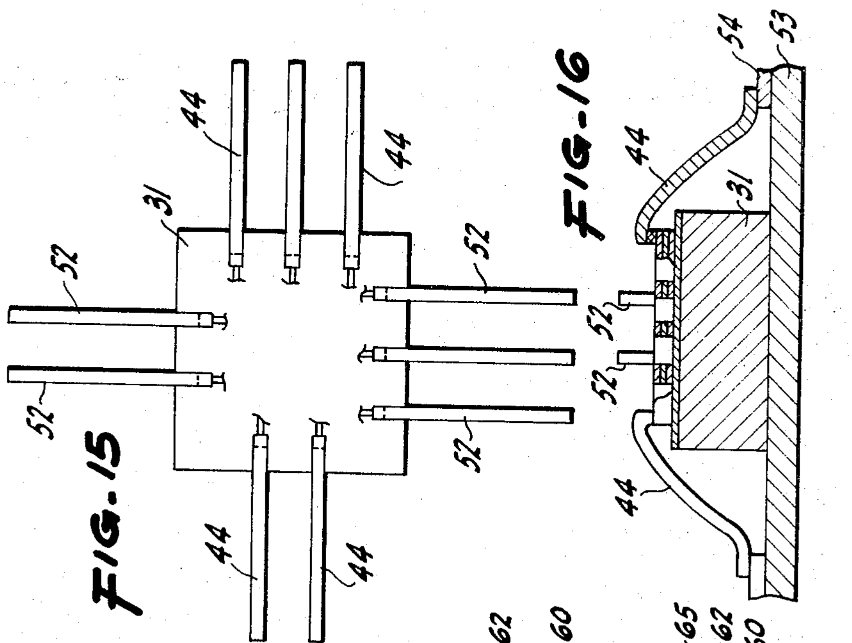

Individual chip 31 having first and second beam-leads 44, 44 and 52, 52 is separated beam-leads 44, 44 and 52, 52 is separated from the wafer 30 along the scribing cracks 33, 33 on the application of force. As shown in FIG. 15, the individual chip 31 has long beam-leads 44, 52 enough to permit the chip to be face-up bonded. In case where the scribed portions 33, 33 is not formed, the back face of the chip 31 may be subjected to the etching or scribing treatment to facilitate chip separation. As shown in FIG. 16, beam-lead chip 31 is face-up bonded to appropriate substrate 53 and its first and second beam-leads 44 and 52 are respectively bonded to the lead contacts 54, 54. Such obtained semiconductor device has extremely high mechanical strength and extremely high reliability since its beam-leads are formed by electroplating treatment.

Example III

Figure 17A:
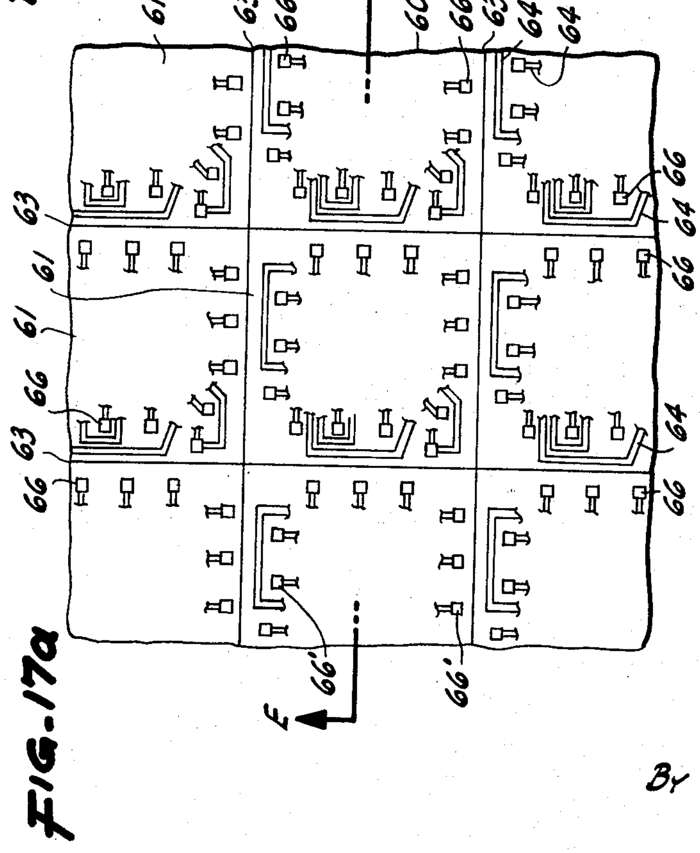
Figures 17B, 18:
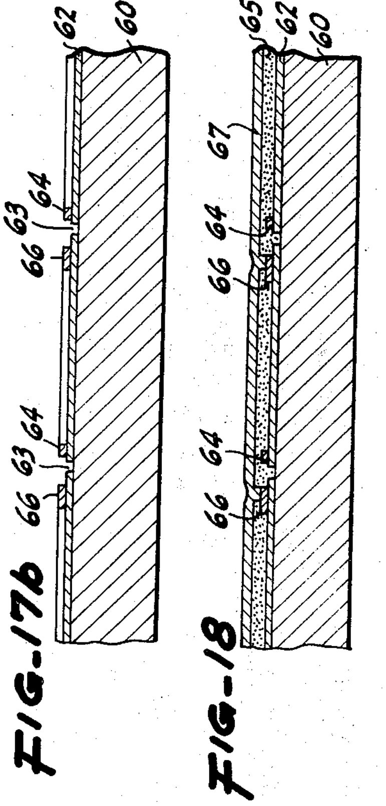

Referring to FIGS. 17a and 17b, the silicon dioxide layer 62 on the silicon wafer 60 is photographically etched to form contact windows and to form boundary markers 63, 63 between chips 61, 61. Evaporated-aluminum layer is deposited on all the upper face of the wafer 60 and deposited layer is selectively etched to form aluminum interconnection layers 64, 64. In this case the pad members 66, 66, 66', 66', are allmost placed along the boundary 63, and some pad members 66', 66' of these are placed inside the interconnection pattern layers 64, 64 to facilitate pattern design. Each pair of the pad members in the vicinity of the chip boundary is further previously are placed with the shifted positions not to cross each other.

Anneal treatment is applied to the wafer 60 to obtain a good ohmic contact. The anneal treatment is accomplished in an atmosphere of vacuum, nitrogen gas or mixed gases of nitrogen and hydrogen not to exidize the surfaces of the interconnection layers 64, 64 and the pad members 66, 66, 66', 66'.

Figures 23, 24, 25:
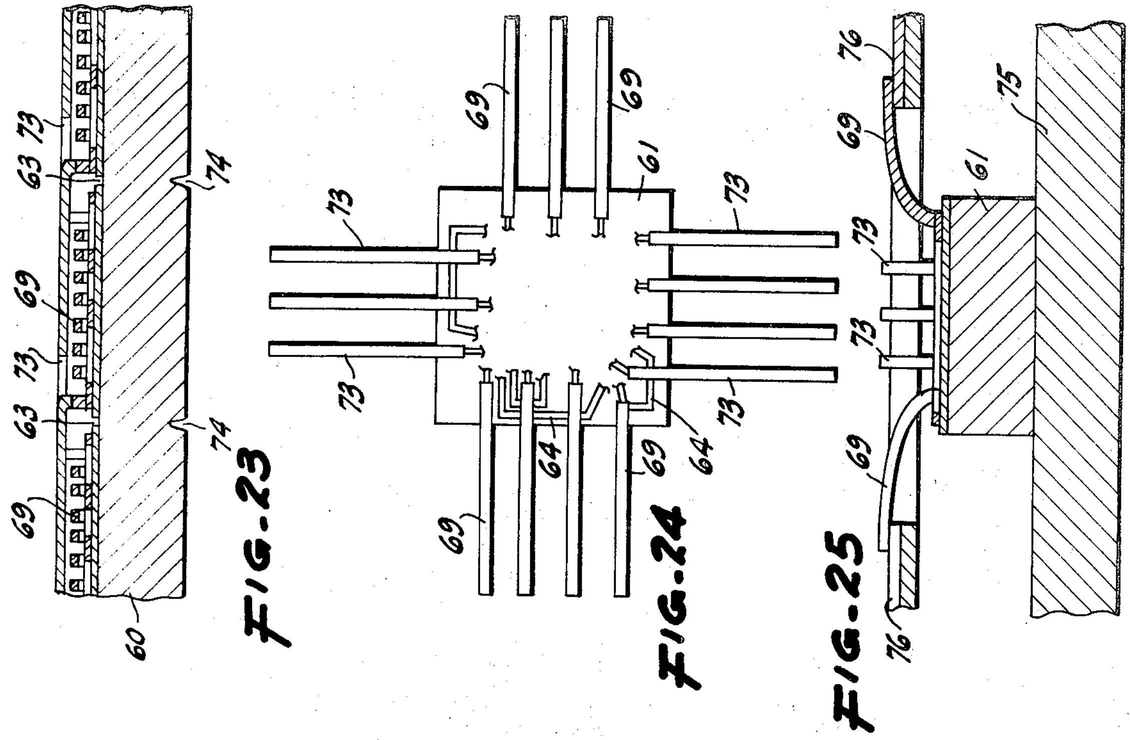

After all the upper face of the wafer is coated with photoresist material, as shown in FIG. 18, the photoresist layer coating on all the pad members 66, 66, 66', 66' are removed by photoetching techniques and simultaneously the spacer film 65 is formed with the remaining photoresist layer. The wafer 60 is next subjected to vacuum evaporation-aluminum layer 67 with a thickness of about 7–8 microns. During the evaporation process it is desirable that the wafer 60 is heated at high temperature enough to obtain close bonds between the pad members 66, 66, 66', 66' and the aluminum layer 67 and not to damage the photoresist layer 65 (for example, photoresist layer, KPR (trade mark of Eastman Kodak Co.), wafer tamperature: 200° C). After the desposition of photoresist material, as shown in FIGS. 19a and 19b, a pattern is applied to the deposited photoresist layer 68 to selectively expose the surface of the aluminum layer 67. The exposed aluminum surface extends from a certain chip 61 to the neighboring chip 61. Thereafter the exposed aluminum layer 67 is removed with a etchant of phosphoric acid and the beam-leads 69, 69 are formed, as shown in FIG. 20. The beam-leads 69, 69 are distant from the interconnection layer 64 through the spacer film 65 and the both do not touch each other. It will be noted that the aluminum layer 67 is remained on the pad members 66′, 66′ which beam-lead is not formed on. Thereafter the upper photoresist layer 68 is removed by the lower photoresist layer 65 is remained. Thus two kinds of photoresist material must be used. For example, the photoresist material, KPR (trademark) is used as the spacer film 65 and the photoresist material, AZ-1350 (trademark of Shipley Company) is used as the etching mask 68. Since the photoresist material, AZ-1350 is removed with a solvent of acetone and the photoresist material KPR is not dissolved, the photoresist layer 68 can be only removed. It is desirable that the beam-leads 69, 69 have lengths of about 400 – 500 microns. The photoresist material is again deposited on all the upper face of the wafer 60. As show in FIGS. 21*a* and 21*b*, the photoresist layer on the remained pad members 66′, 66′ is removed to form the second spacer film 70, and then the aluminum layer 71 is deposited on all the wafer upper face with a thickness of about 7 – 8 microns at a relative high temperature. After the deposition of photoresist material, a pattern for beam-leads is applied to this photoresist surface to remove the photoresist layer 72 selectively. The exposed aluminum layer 71 is removed with a etchant of phosphoric acid and then, as shown in FIG. 22, the second beam-leads 73, 73 are formed. The beam-leads 73, 73 extend also from a certain chip 61 from the neighboring chip 61. The second beam-lead 73 is distant from the first beam-lead 69 through the spacer film 70 and thus the both do not touch each other. As shown in FIG. 23, three photoresist layers 65, 70 and 72 are removed with appropriate solvents. The back face of the wafer is scribed to form scribing portions 74, 74 and, as shown in FIG. 24, individual chip 61 is separated from the wafer 60.

In FIG. 25, such obtained beam-lead chip 61 is face-up bonded to appropriate substrate 75 and the first and second beam-leads 69 and 73 are respectively bonded to the lead contacts 76, 76. Since some of the beam-leads 73 and 69 extend from the inner interconnection layer 64, the lead contacts 76, 76 must be placed upper than the chip upper face to prevent electrical tough between the beam-leads and the interconnection layers 64.

Figure 26A:
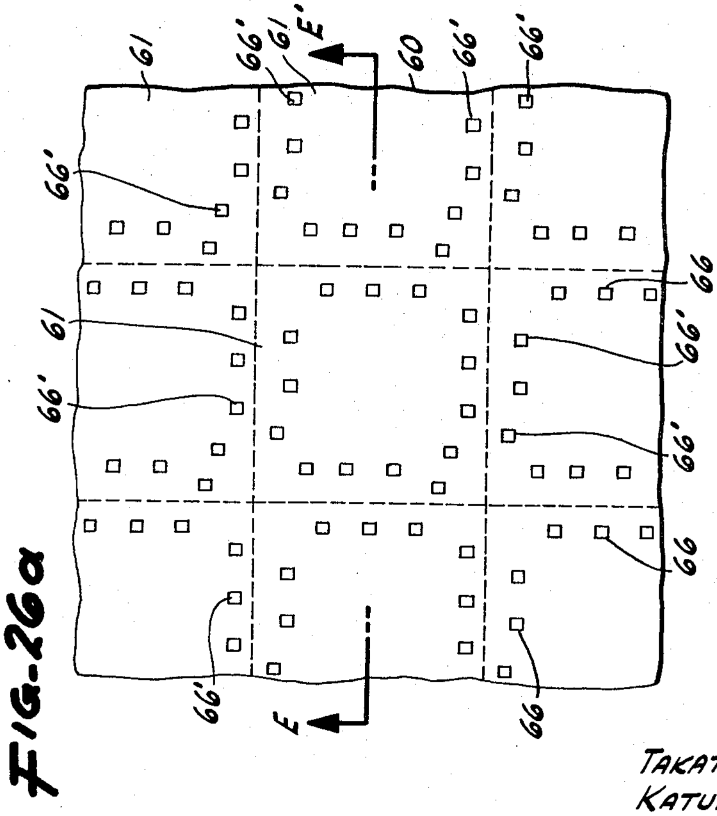
Figure 26B:
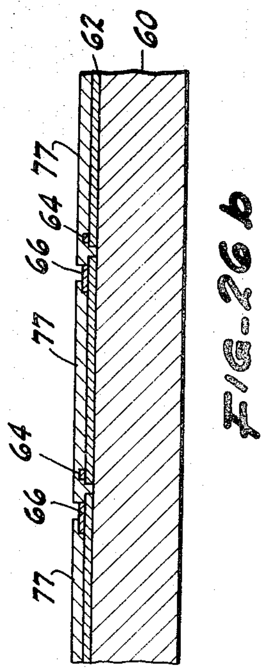

The processes described in Example III may be modified in order to prevent electrical touch between the beam-lead and the interconnection layer and to protect the surface of the chip. As shown in FIGS. 26*a* and 26*b*, after the formation of aluminum interconnection layer 64, 64, silicon dioxide insulating layer 77 is deposited on all the upper face of the wafer 60 by chemical vapor deposition technique at a temperature of about 400°C. The insulating layer 77 coating on the pad members 66, 66, 66′, 66′ is removed by photoetching technique and then the beam-leads are formed. The insulating film 77 may be made by sputtering treatment. The multi-layer structure of $SiO_2$-$Al_2O_3$-$P_2O_5$-$SiO_2$ may be made.

Figure 27:
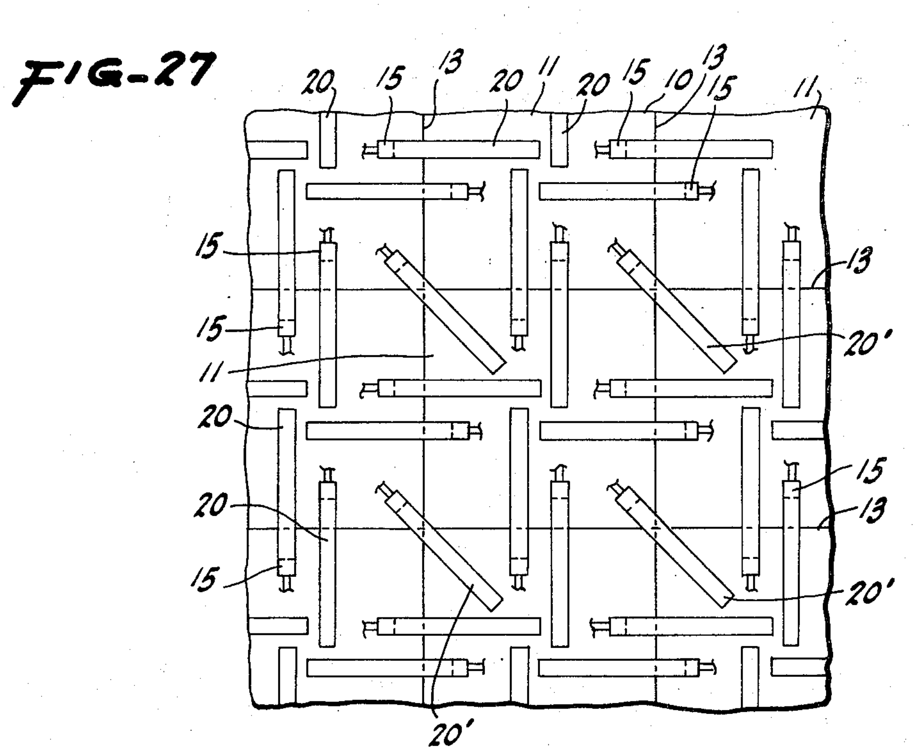
FIG. 27 shows modification of the first example.
Figure 28:
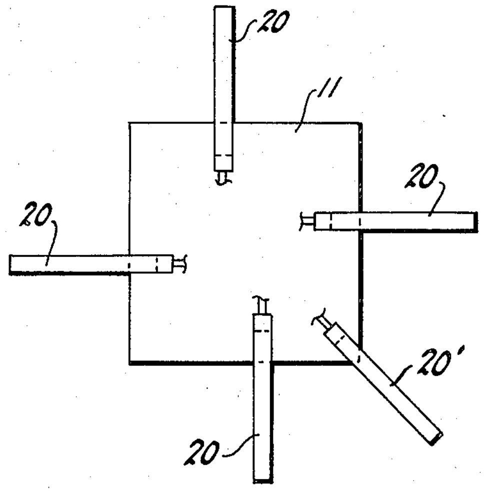
FIG. 28 shows the chip separated from the wafer as shown in FIG. 27.

By the way, in the beam-lead semiconductor device such as integrated circuit or discrete transistor for operation at high frequencies, parasitic capacitances between beam-leads exert a harmful influence upon its frequency response. The device having beam-leads exert a harmful influence upon its frequency response. The device having beam-leads in parallel is not fit for operation at high frequencies because of high parasitic capacitances. The processes described in Example I may be also modified in order to obtain satisfactory device for operation at high frequencies. As shown in FIG. 27, the pad members 15, 15 are previously positioned in order that the beam-leads are not in parallel. Thereafter the beam-leads 20, 20, 20′, 20′, which extend from corners of a certain chip to the neighboring chip along diagonal lines, are formed. The back face of the wafer 10 is next etched along the boundary markers 13 and individual chip 11 is separated from the wafer 10. Since the parasitic capacitances between the beam-leads are extremely low, such device is suitable for operation at high frequencies.

As is well known, the manufacturing processes may be modified according to choice of semiconductor material, connection method, interconnection material, or lead material. For example, chromium, titanium, molybedenum, tungsten, platinum, gold or combination of these metals may be used as interconnection material. Further evaporated-aluminum layer, syhthetic resin or glass may be used as the spacer film. In addition, copper may be used in stead of aluminum or nickel as the evaporated-metal layer covering on the spacer film. In case where the formation of beam-leads is accomplished by evaporation treatment, the lead metal material may be selectively deposited by use of metal mask for evaporation according to the predetermined pattern thereby to simplify the manufacturing processes. Silver, copper, gold or aluminum may be used as lead material.

Considering the number arrangement and dimention of the beam-lead, one ends of the beam-leads may be deposited on four sides of the chip without the formation of multi-step structure. In case of large scale chip the beam-leads may be formed without the formation of multi-step structure in consideration of arrangement of the beam-leads.

We claim:

1. The method for manufacturing semiconductor device comprising the following steps: preparing a semiconductor wafer wherein a plurality of semiconductor chips are formed, each chip having at least one circuit element and further first and second pad members respectively deposited on first and second limited areas of a surface of the semiconductor wafer and being electrically connected with the circuit element; depositing a first spacer film coating on the remaining surface except the first and second pad areas; forming a first beam-lead coating on the first spacer film, the first beam-lead in a certain chip being electrically connected with the first pad member in the same chip and extending to the neighboring chip across the boundary between said two chips; depositing a second spacer film coating on the remaining surface except the second pad area; forming a second beam-lead coating on the second spacer film, the second beam-lead in a certain chip being electrically connected with the second pad member in the same chip and extending to the neighboring chip; removing the first and second spacer films from the wafer; and separating the chips from the wafer.

2. A method for forming beam leads for a semiconductor device comprising the following steps: preparing a semiconductor wafer comprising a plurality of semiconductor chips formed therein, each chip including at least one circuit element and at least one pad member formed in a first limited area of a surface of the semiconductor wafer and electrically connected with the circuit element in the same chip; depositing a spacer film on a second limited area of surface of the semiconductor wafer excepting said first limited area where the pad member is formed; forming at least one beam lead over the spacer film for each semiconductor chip with an end portion electrically attached to the pad member in the same chip said beam lead extending to the neighboring chip across the boundary between said two chips; removing the spacer film interposed between the surface of the wafer and the beam lead therefrom after the formation of the beam lead whereby each beam lead is spaced away from the surface of the wafer without any interposed material; and thereafter separating the chips from the semiconductor wafer along a crack in the boundary area between said two chips whereby the beam lead remains spaced away from the wafer excepting its end portion attached to the pad member.

3. A method for forming beam leads for a semiconductor device as in claim 2 wherein the spacer is made of a photoresist film.

4. A method for forming beam leads for a semiconductor device as in claim 2 wherein the spacer film is made of an evaporated metal layer, synthetic resin, or glass.

5. A method for forming beam leads for a semiconductor device as in claim 2 further comprising the step of forming an evaporated metal layer on the spacer film for reducing thermal shock of the photoresist film, the evaporated metal layer being deposited between the spacer film and the thereafter formed beam lead.

6. A method for forming beam leads for a semiconductor device as in claim 2 further comprising the step of forming two evaporated metal layers for improving mechanical bond and electrical contact between the pad member and the beam lead.

7. A method for forming beam leads for semiconductor device as set forth in claim 6 wherein the beam lead is gold and the two evaporated metal layers are aluminum and nickel respectively while the semiconductor wafer is silicon.

8. A method for forming beam leads for semiconductor devices as in claim 2 wherein the semiconductor chip is an integrated circuit device.

9. A method for forming beam leads for semiconductor devices as in claim 2 wherein the semiconductor chip is a discrete semiconductor element.

10. A method for manufacturing a semiconductor device as set forth in claim 1 wherein the first and second beam leads intersect in different planes.

* * * * *